(12) United States Patent
Higashida et al.

(10) Patent No.: US 6,453,811 B1
(45) Date of Patent: *Sep. 24, 2002

(54) PRINTING METHOD AND PRINTING APPARATUS

(75) Inventors: Takaaki Higashida, Kadoma; Hiroyuki Otani, Ikoma; Takahiko Iwaki, Toyonaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/650,725

(22) Filed: Aug. 30, 2000

Related U.S. Application Data

(63) Continuation of application No. 08/983,448, filed as application No. PCT/JP96/01929 on Jul. 12, 1995, now Pat. No. 6,135,024.

(30) Foreign Application Priority Data

Jul. 12, 1995 (JP) .............................. 7-175795

(51) Int. Cl.[7] .............................................. B41F 15/44
(52) U.S. Cl. ...................................... 101/123; 101/129
(58) Field of Search ................................ 101/114, 123, 101/124, 119, 120, 129; 427/96, 97, 299, 313, 356; 118/413

(56) References Cited

U.S. PATENT DOCUMENTS

| | | | |
|---|---|---|---|
| 3,735,730 A | 5/1973 | Mitter ......................... | 101/120 |
| 3,754,979 A | 8/1973 | Larry .......................... | 101/127 |
| 3,877,371 A | 4/1975 | Jaffa .......................... | 101/425 |
| 3,902,414 A | 9/1975 | Zimmer et al. .............. | 101/129 |
| 4,051,777 A | 10/1977 | Black et al. ................ | 101/123 |
| 4,137,842 A | 2/1979 | Miller ......................... | 101/127 |
| 4,179,797 A | * 12/1979 | Johnson ..................... | 29/610.1 |
| 4,478,884 A | * 10/1984 | Barnes et al. ............... | 427/97 |
| 4,728,568 A | 3/1988 | Sasada et al. ............... | 428/349 |
| 4,817,524 A | 4/1989 | Riemer ....................... | 101/123 |
| 4,949,636 A | 8/1990 | Tachibana ................... | 101/123 |
| 5,001,979 A | 3/1991 | Kürten ........................ | 101/123 |
| 5,050,497 A | 9/1991 | Klemm ....................... | 101/124 |
| 5,309,837 A | 5/1994 | Nanzai ....................... | 101/129 |
| 5,410,957 A | 5/1995 | Tanaka et al. .............. | 101/127 |
| 5,479,854 A | 1/1996 | Chikahisa et al. .......... | 101/123 |
| 5,552,756 A | * 9/1996 | Ushiro ........................ | 336/200 |
| 5,707,575 A | * 1/1998 | Litt et al. .................... | 264/104 |
| 5,715,748 A | 2/1998 | Murakami et al. .......... | 101/120 |
| 5,759,269 A | 6/1998 | Cutting et al. .............. | 101/123 |
| 6,135,024 A | * 10/2000 | Higashida et al. .......... | 101/123 |

FOREIGN PATENT DOCUMENTS

| | | |
|---|---|---|
| DE | 2901830 | 8/1979 |
| EP | 0197906 | 1/1986 |
| EP | 0277265 | 8/1988 |
| EP | 0349506 | 1/1990 |
| EP | 0358434 | 3/1990 |
| JP | 01171944 | 7/1989 |
| JP | 02054988 | 2/1990 |
| JP | 3-193448 | 8/1991 |
| JP | 03193448 | 8/1991 |
| JP | 4-124638 | 11/1992 |
| JP | 6-79538 | 11/1994 |
| JP | 07017015 | 1/1995 |

OTHER PUBLICATIONS

Dietrich E. Riemer, Ink Hydrodynamics of Screen Printing, Proceeding of the 1985 ISHM Symposium, pp. 52–57.

* cited by examiner

*Primary Examiner*—Stephen R. Funk
(74) *Attorney, Agent, or Firm*—Wenderoth, Lind & Ponack, L.L.P.

(57) ABSTRACT

Regarding filling of a paste, a temperature gradient at a paste-pressing face is managed by a heater incorporated in a filling head. Alternatively, a nonvolatile component is applied to a printing face of a base material before the paste is filled, thereby preventing a volatile component of the paste from evaporating with time. Viscosity of the paste is thus maintained. Meanwhile, a change of the quantity of the paste is coped with by changing a moving speed of the filling head or a contact angle of the filling head to the printing face, or by supporting the filling head at the side in touch with the printing face.

3 Claims, 9 Drawing Sheets

PRINTING METHOD AND PRINTING APPARATUS

TECHNICAL FIELD

This is a continuation application of U.S. patent application Ser. No. 08/983,448, now U.S. Pat. No. 6,135,024, filed on Mar. 25, 1998 which was the national phase application of international application PCT/JP96/01929, filed Jul. 12, 1995.

The present invention relates to a printing method and a printing apparatus for filling a printing material into openings of a printing face of a body to be printed, and more particularly, to a printing method and a printing apparatus for applying paste, and to an apparatus for manufacturing circuit boards for electronic devices, etc.

BACKGROUND ART

Recently, circuit boards have been changed from single-face boards having circuits formed on one face, to double-face boards and multilayer circuit boards so as to achieve compact and high-performance apparatuses. Many of the boards adopted at present are advanced multilayered ones. In the meantime, a printing technique using a filling head, i.e., a squeegee is employed in order to press and fill a paste into openings such as via holes or through holes in these circuit boards, or to press and fill the paste into openings of a metal mask to form circuits on the board. A lot of conditions are involved in the printing technique, for instance, hardness of the squeegee, angle of the squeegee to a printing face, pressure of the squeegee to the printing face, filling speed of the squeegee to the openings of the printing face, etc. Even a slight error in setting of the conditions adversely influences the quality of printing films, and therefore the set conditions are adjusted based on experiences on the production line, thereby improving yields in the paste filling process and quality of products.

Some adaptations are also made to the aforementioned squeegee in the filling process. For example, the squeegee is improved in shape to have a flat, a sharp, or a curved contact face as the printing face. In one arrangement, a heater is built in the squeegee to heat the squeegee itself to a fixed temperature, thereby lowering a viscosity of the paste and increasing filling efficiency for the paste to the openings of the printing face.

The viscosity of the paste increases in proportion to an operating time of the squeegee. For stabilizing the viscosity, therefore, the paste is exchanged at a fixed time interval, or an organic solvent is added to the paste to adjust the viscosity.

Meanwhile, the amount of the paste filled into the openings, e.g., via holes and through holes, etc. or the openings of the metal mask is controlled and stabilized by filling the paste up to a surface of the openings.

An example of the conventional circuit board-manufacturing method will be described with reference to FIGS. 13A, 13B.

FIGS. 13A, 13B respectively represent examples of a manufacturing method and a manufacturing apparatus for circuit boards in the filling process according to the conventional art.

In FIGS. 13A, 13B, 300 denotes a metal mask placed on a base material 301. 303 and 305 denote squeegees which move on the metal mask 300 while keeping touch with the metal mask 300. 304 denotes a paste, and 302 denotes a stage. The base material 301 is disposed in touch with on the stage 302. The metal mask 300 is arranged with a slight space above the base material 301, onto which the paste 304 is supplied. The squeegees 303, 305 located above the metal mask 300 can move in an up/down direction and in a printing direction of the squeegees 303, 305.

The paste is filled in the thus-constructed apparatus in a process described herein. The base material 301 is first set at a predetermined position on the stage 302. A through hole 301a formed in the base material 301 is registered with a hole 300a formed in the metal mask 300, and the metal mask 300 is set above the base material 301. The paste 304 is supplied onto the metal mask 300. The squeegees 303, 305 are lowered to hold the base material 301 by pressing a predetermined pressure on to the material 301. Thereafter, the squeegees 303, 305 are moved in the printing direction to move the paste 304 on the metal mask 300, thereby printing onto the base material 301. The paste 304 is pressed and filled in the through holes 301a formed in the base material 301 in this manner.

In the above paste filling process in the conventional art, a filling shape or the filling amount of the paste 304 is greatly changed even by mechanical errors, resulting in blanking, insufficient printing, or similar filling failures. When the flat squeegee 305 shown in FIG. 13B is used, a contact angle of the squeegee to the printing face of the metal mask 300 or base material 301 is hard to fix and maintain. The amount of the paste filled in the through hole 301a varies greatly and is considerably difficult to control properly. This is an important issue. In the case of the square squeegee 303 as shown in FIG. 13A, the contact angle of the squeegee to the printing face of the metal mask 300 or base material 301 is easy to set. A front end part of the square squeegee 303 in touch with the printing face of the base material 301 is not sufficiently sharp, and consequently the paste 304 is left on the metal mask 300 or base material 301. The front end part of the square squeegee can hold only a small amount of the paste 304. This makes it necessary to frequently replenish the paste 304, and thus deteriorates productivity. When a viscosity of the paste 304 is increased because of the evaporation of volatile components or when the paste of a high viscosity is used, considerably less paste is filled than if kept under the originally properly set conditions. In other words, the filling condition should be re-set during operation although this takes a long time. This is another issue. In the case where a heater is incorporated in the squeegee 303, 305, this arrangement merely lowers the viscosity of the paste 304. This does not effectively influence the rolling or filling of the paste 304 and raises the necessity for setting and adjusting the conditions again. Poor productivity still remains as an issue.

The object of the present invention is therefore to provide a printing method and a printing apparatus whereby a sufficient filling amount of a printing material into openings of a body to be printed is secured in conformity with various filling conditions, to thereby improve yields, quality, and productivity for printing with the printing material.

SUMMARY OF THE INVENTION

According to a first aspect of the present invention, there is provided a printing method for pressing and filling a printing material by means of a filling head to openings of a body to be printed, wherein a flow pressure of the printing material is kept roughly constant during printing of the printing material.

According to a second aspect of the present invention, at least either a contact angle of the filling head to a printing face of the body to be printed or the speed of the filling head can be changed in accordance with a change of the amount of the printing material in the above first aspect, thereby keeping the flow pressure of the printing material roughly constant.

According to a third aspect of the present invention, printing of the printing material can be conducted in the above first or second aspect while the filling head is supported at the side (first side) of a pressing face thereof in touch with the printing face of the body to be printed, thereby keeping the flow pressure of the printing material roughly constant.

According to a fourth aspect of the present invention, in any one of the above-described first-third aspects of the invention, a temperature gradient can be applied to the pressing face of the filling head so that a temperature of a part in touch with the printing face of the body to be printed is higher than that of a part away (second side) from the printing face of the body to be printed and the filling head, thereby keeping the flow pressure of the printing material roughly constant.

According to a fifth aspect of the present invention, in any one of the first through fourth aspects, a pretreatment material can be applied before the printing material is filled by the filling head into the openings at the printing face of the body to be printed, thereby keeping the flow pressure of the printing material roughly constant.

According to a sixth aspect of the present invention, there is provided a printing apparatus for pressing and filling a printing material by a filling head into openings of a body to be printed, which includes a holding device for keeping a flow pressure of the printing material roughly constant during printing of the printing material.

According to a seventh aspect of the present invention, the holding device in the sixth aspect can be a control part which changes at least either a contact angle of the filling head to a printing face of the body to be printed, or the speed of the filling head in accordance with a change of the amount of the printing material.

According to an eighth aspect of the present invention, the holding device in the seventh aspect can be a supporting member for supporting the filling head at the side of a pressing face thereof in touch with the printing face of the body to be printed.

According to a ninth aspect of the present invention, the holding device in any one of the sixth through eighth aspects can have a temperature-adjusting element which applies a temperature gradient to the pressing face of the filling head so that a temperature of a part in touch with the printing face of the body to be printed is higher than that of a part away from the printing face of the body to be printed and the filling head.

According to a tenth aspect of the present invention, the temperature-adjusting element in the ninth aspect can be adapted to set an optimal temperature gradient along the pressing face of the filling head from the side in touch with the printing face of the body to be printed.

According to an eleventh aspect of the present invention, the holding device in any one of the sixth through tenth aspects can have a pretreatment head for applying a pretreatment material to the filling head and the printing face of the body to be printed before the printing material is filled.

According to the present invention, during filling of the printing material, the flow pressure of the printing material is kept roughly constant, so that a sufficient filling amount of the printing material is secured into openings of the body to be printed in conformity with various filling conditions, thereby improving a yield, quality, and productivity of printing.

In the printing method and the printing apparatus of the above described aspects of the present invention, the filling head moves to press and fill. the printing material into openings of the base material or metal mask. At least either the contact angle of the filling head in relation to the printing face of the base material or metal mask, or the speed of the filling head is changed under a predetermined condition. For instance, a predetermined condition could be changing amount of the printing material as the filling head moves forward. Therefore, the flow pressure of the printing material is kept roughly constant to cope with an increase of a viscosity of the printing material with time or a decrease of the filling/pressing force due to the consumption of the printing material, etc. A predetermined amount of the printing material is stably secured at all times, thereby improving continuous printing efficiency.

According to the printing method and the printing apparatus of the further aspects of the present invention, the filling head is supported at the side of the pressing face thereof in touch with the printing face of the base material or metal mask. The side away from the printing face is rendered a free end and deformable, so that required flexibility is attained. The printing material is controlled so as to not leak when pressed by the filling head at the side in touch with the printing face. A necessary minimum elasticity is ensured for the filling head to trace the uneven printing face of the base material or metal mask. The flow pressure of the printing material is thus maintained roughly constant. A predetermined amount of the printing material is stably filled without any special control means against an increase of the viscosity of the printing material with time and reduction in volume of the printing material because of the consumption. Continuous printing efficiency can be improved.

In the printing method and the printing apparatus of the yet further aspect of the present invention, a predetermined temperature gradient is applied to the pressing face of the filling head. The temperature at the side of the pressing face in touch with the printing face is made high and the temperature decreases along the pressing face away from the printing face. As a result, the viscosity of the rolling printing material in touch with the printing face is lowered, thereby improving fluidity of the printing material and maintaining the nearly constant flow pressure of the printing material. At the same time, the temperature at the side of the pressing face away from the printing face is lower, whereby the fluidity is limited. Thereby hydraulic pressure of the pressing face of the part in touch with the printing face increases. Accordingly, not only a predetermined amount of the printing material is stably filled, but the evaporation of volatile components is restricted at the low temperature part. All of the printing material can be easily maintained at a predetermined viscosity, and continuous printing efficiency can be improved.

With the use of the temperature-adjusting element for applying the above-described temperature gradient, and when the temperature-adjusting element is constituted to set an optimal temperature gradient to a section of the pressing face away from the printing face of the base material or metal mask, circuit boards of various conditions can be manufactured with high quality in accordance with a variety of printing materials and filling conditions.

In the printing method and the printing apparatus of the different aspects of the present invention, in addition to the pressing and filling of the printing material by means of the filling head to openings of the base material or metal mask, the pretreatment head that is additionally provided is driven to apply the pretreatment material to the printing face of the base material or metal mask prior to the filling of the printing material. The effect of applying the nonvolatile organic substance can be achieved in one single filling process. If the pretreatment material, e.g., nonvolatile organic component. contained in the printing material is applied onto the body to be printed before the printing material is filled, an increase of the viscosity of the printing material can be suppressed. Thereby the flow pressure of the printing material. is maintained nearly constant and the continuous printing performance improves. Although the volatile component evaporates after the printing, the nonvolatile component adsorbs into the printing face which results in a change of a composition of the printing material. As such, the nonvolatile component is applied beforehand to prevent the change of the composition.

BRIEF DESCRIPTION OF DRAWINGS

These and other objects and features of the present invention will become clear from the following description taken in conjunction with the preferred embodiments thereof- with reference to the accompanying drawings, in which.

BEST MODE FOR CARRYING OUT THE INVENTION

Figure 1:
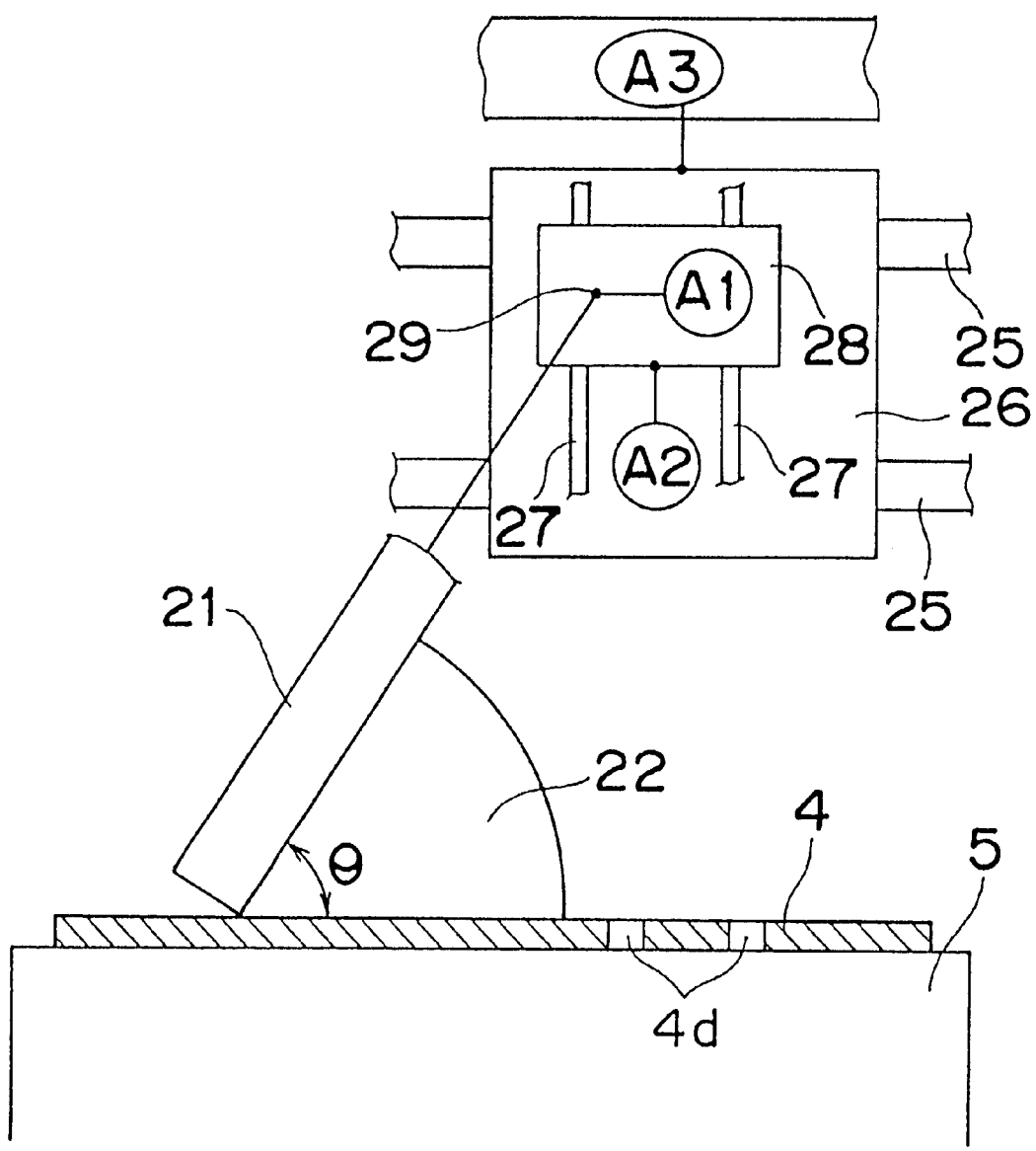
FIG. 1 is a diagram of a part with a paste-filling function for a circuit board-manufacturing apparatus in which a printing apparatus for executing a printing method in a first embodiment of the present invention is installed.

Before the description of the present invention proceeds, it is noted that like parts are designated by like reference numerals throughout the accompanying drawings.

In order to describe a printing method and a printing apparatus in embodiments of the present invention, a method and an printing method and printing apparatus provided will be depicted below with reference to the drawings.

First Embodiment

Figure 2:
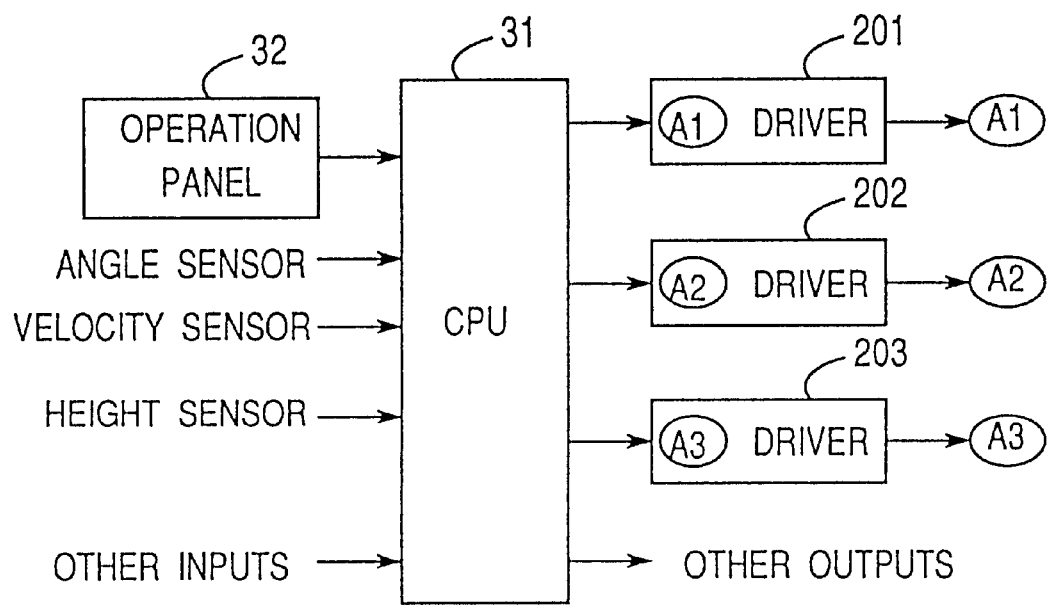
FIG. 2 is a block diagram of a control circuit related to the paste-filling part of the apparatus in FIG. 1.

FIGS. 1, 2 are diagrams of an apparatus used in a filling process in order to manufacture circuit boards with a printing method and a printing apparatus according to a first embodiment of the present invention provided.

As is schematically illustrated in FIG. 1, in the apparatus used in the filling process, a filling head 21 for filling a paste 22 (an example of the printing material) onto a base material 4 (an example of the body to be printed) on a stage 5. The filling head 21 is moved. in a filling direction, e.g., by a pair of right and left transverse guides 25 parallel in the drawing to a printing face of the stage 5 and a transverse slider 26 guided by the guides. The filling head 21 is also moved up and down by a pair of vertical guides 27 arranged above the slider 26 in a vertical direction and a slider 28 guided by the guides 27. The filling head 21 is pivotally supported by a shaft 29 on the vertical slider 28 in a rotatable fashion. At this time, a part of the filling head 21 in touch with the base material 4 is a free end. A contact angle θ between the filling head 21 to a printing face of the base material 4 is variable.

The filling head 21 is rotated about the shaft 29 by driving of an actuator A1 coupled to the shaft 29 and set on the vertical slider 28. Moreover, the filling head 21 is moved up and down via the vertical slider 28 by driving of an actuator A2 coupled to the vertical slider 28 and mounted to the transverse slider 26. The filling head 21 is also moved right and left via the transverse slider 26 by driving an actuator A3 coupled to the transverse slider 26. Each actuator is constructed by, for example, a motor, a ball screw shaft coupled to a rotary shaft of the motor and a nut screwed to the ball screw shaft and fixed to a driven member.

FIG. 2 shows an example of a control circuit for controlling driving of the actuators A1, A2, and A3 in the first embodiment. Each of the actuators A1–A3 is controlled by a control part 31 which is a microcomputer through drivers 201, 202 and 203 respectively. Various control conditions including changing speed (printing speed) conditions for the filling head 21 are inputed through an operation panel 32.

Information from sensors detecting an angle, speed, and height of the filling head 21 in relation to the printing face of the base material is inputed into the control part 31. Based on the information detected, the control part 31 of the control circuit through drivers 201, 202, and 203 feedback-controls the actuators A1, A2, and A3 so that information from sensors detecting the angle, speed, and height of the filling head 21 in relation to the printing face of the base material conforms to set values.

In the conventional printing method, a set angle of a squeegee to the printing face of the base material is kept constant during filling of the paste irrespective of the feeding amount of the paste. However, a hydraulic pressure generated in the paste 22 decreases as the amount of the paste 22 is reduced, while lowering a filling force. D.E. Riemar reports the following correlation in "INK HYDRODYNAMICS OF SCREEN PRINTING", Proceedings of the 1985 ISHM Symposium, pages 52–58.

$$p = k\mu v \sqrt{V} / \sin^2 \theta \tag{1}$$

In the equation (1), p is a pressure generated in the paste 22, $\mu$ is a flow velocity of the paste 22, v is a speed of the filling head 21, V is a volume of the paste 22, $\theta$ is a contact angle of the filling head 21 in relation to the printing face of the base material 5, and k is a proportional constant.

A pressure difference expressed by the equation (1) is the pressure difference necessary for filling the paste 22 into a through a hole 4d. Hole 4d is an example of an opening formed in the base material 4. A paste filling state for hole 4d is detected by substituting the pressure difference to the technologically well known Hagen-Poiseulle's law. Therefore, in order to make the filled state of the paste 22 constant, it is important to always maintain the pressure p generated in the paste 22 at a constant pressure during printing.

Conventionally, enough paste is generally supplied to ignore the decreasing amount of paste volume for an even continuous paste-filling operation. However, this does not solve a viscosity change or a composition change of the paste itself.

On the other hand, according to the method of the first embodiment, the reducing amount of the paste 22 in one printing operation, namely, in one stroke of the filling head 21 is done beforehand. The speed of the filling head 21 is increased from v to a speed obtained by an expression (2) shown below, thereby coping with the volumetric change of the paste. The feeding amount of the paste 22 for each time can thus be reduced.

$$v \left( \sqrt{V} / \sqrt{(V - \Delta V)} - 1 \right) \tag{2}$$

The expression (2) is obtained by solving the foregoing equation (1) and the following equation (3).

$$p = k\mu v \sqrt{V - \Delta V} / \sin^2(\theta - \Delta\theta) \tag{3}$$

wherein $\Delta V > 0$.

Since the speed of the filling head 21 is changed in accordance with the changing amount of paste 22, the pressure generated in the paste 22 is maintained constant, and consequently the amount of the paste 21 filled in the through hole 4d of the base material 4 becomes constant.

Changes of the filling force for the paste after 100 sheets are printed in the conventional method based on an initial feed amount of the paste and the method of the first embodiment (new technique) are confirmed in Table 1 in terms of a changing ratio of a filling depth of the paste. Regarding the above description of "based on the initial feed amount of the paste", this implies that the paste is not added after once initially supplied. The initial amount is compared with the amount of paste after 100 sheets are printed, and the result is represented by the filling rate in Table 1. For instance, when the amount of paste is 500 g, a difference from a filling rate 100–99.5% is the changing ratio of the conventional method. In the method of the first embodiment, the amount of the paste is not changed and therefore the filling rate is 100% and the changing ratio before and after printing is 0%.

TABLE 1

| Amount of paste | Filling rate up to filling depth in conventional method | Filling rate up to filling depth in new technique |
|---|---|---|
| 500 g | 99.5% | 100% |
| 300 g | 99.2% | 100% |
| 100 g | 97.5% | 100% |
| 50 g | 94.9% | 100% |
| 30 g | 91.3% | 100% |

As is clearly confirmed from Table 1, the speed control to the filling head 21 in the first embodiment is effective.

As described herein and above, since the moving speed of the filling head 21 is controlled by the control part 31 via the actuator A3 in accordance with the change of the amount of the paste 22 during printing, the pressure generated in the paste 22 is maintained constant, whereby the filling amount of the paste 22 into the through hole 4d of the base material 4 is uniform. The paste can be continuously printed efficiently, with productivity improved.

In the above-described first embodiment, the speed of the filling head 21 is controlled to maintain constant the pressure in the paste 22. On the other hand, the angle of the filling head 21 to the printing face of the base material can be controlled by driving the actuator A1 in accordance with the changing amount of the paste 22, thereby holding the pressure in the paste 22 constant. The same effect can be achieved in this manner as well. More specifically, $\Delta\theta$ satisfying the following equation (4) is obtained and the actuator A1 is driven by the control part 31 so that the angle of the filling head 21 is reduced every $\Delta\theta$, whereby the same effect as achieved by the above speed control can be realized.

$$\sin(\theta - \Delta\theta) = \sqrt{\sqrt{(V - \Delta V)} / \sqrt{V}} \sin\theta \tag{4}$$

Figure 5:
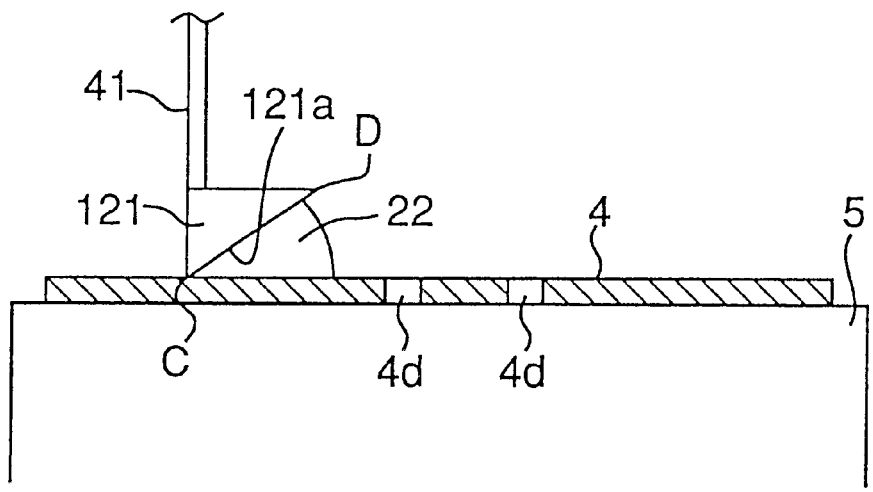
FIG. 5 is a diagram of a part with a paste-filling function of a circuit board-manufacturing apparatus in which a printing apparatus for executing a printing method in a third embodiment of the present invention is installed.

The contact angle $\theta$ to the printing face of the base material 4 is automatically changed in the first embodiment by rotating the filling head 21 about the shaft 29 by the actuator A1. The filling rate is also improved by reducing the contact angle $\theta$, thereby coping with the changing amount of paste. Needless to say, when the contact angle $\theta$ of the filling head 21, specifically, free end of the filling head in touch with the printing face is changed, a height of the free end is changed, which should be corrected by suitably driving the actuators A2 and A3 by the control part 31 to suitably move the filling head 21 up/down and right/left to maintain the filling head 21 at a predetermined height. This way of angle correction to a predetermined angle is unnecessary if the filling head shown in FIG. 5 is used.

In the first embodiment, both the speed and the contact angle $\theta$ of the filling head 21 may be adapted to meet the changing amount of paste.

Second Embodiment

Figure 3:
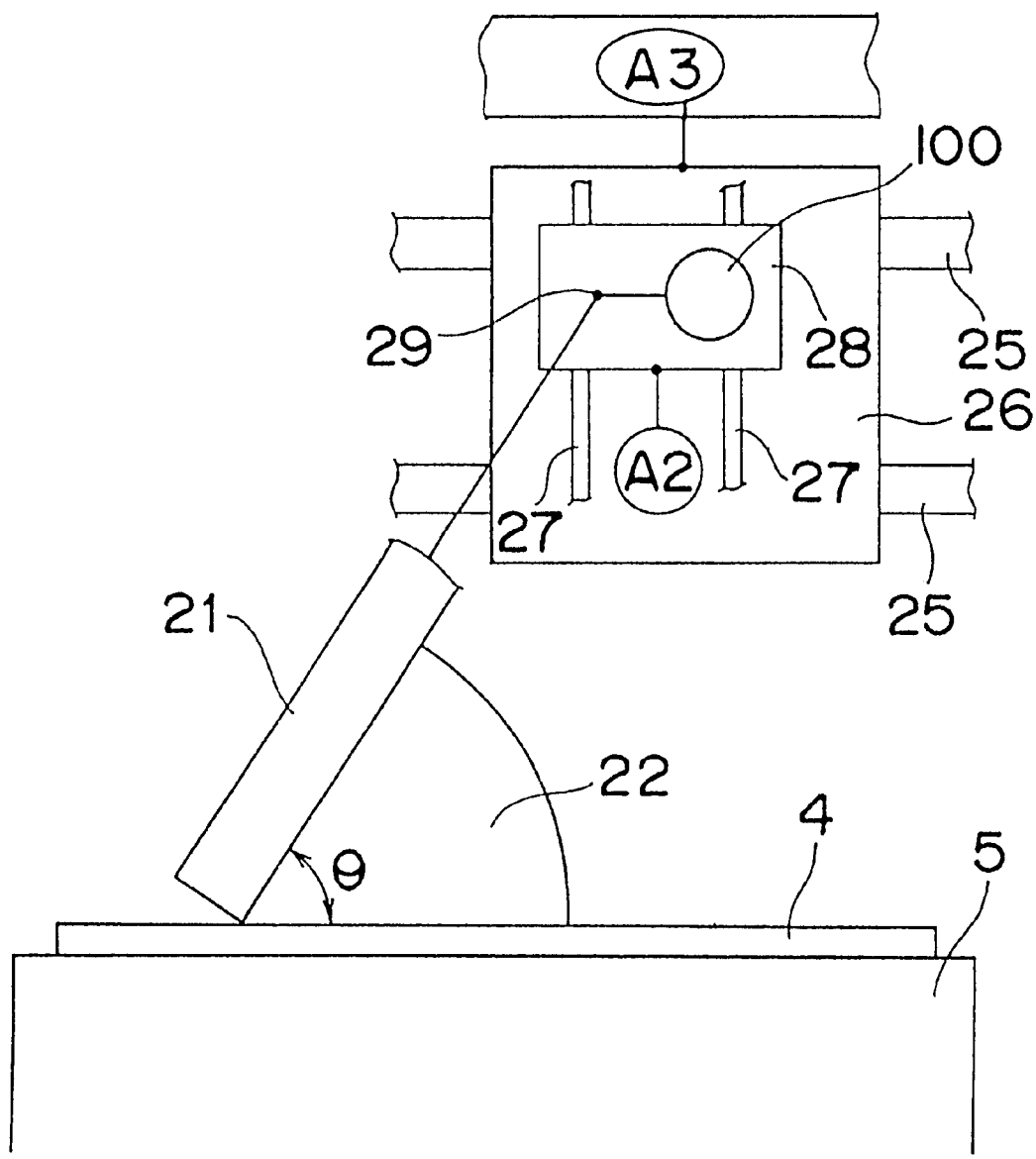
FIG. 3 is a diagram of a part with a paste-filling function of a circuit board-manufacturing apparatus in which- a printing apparatus for executing a printing method in a second embodiment of the present invention is installed.
Figure 4:
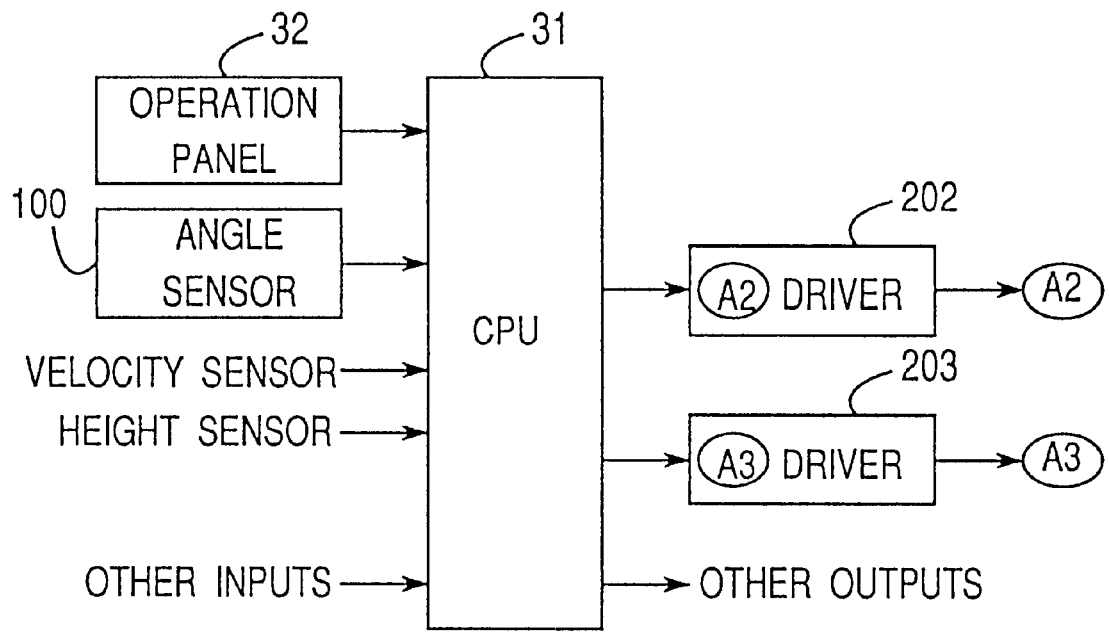
FIG. 4 is a block diagram of a control circuit related to the paste-filling part of the apparatus of FIG. 3.

FIGS. 3, 4 are diagrams of an apparatus used in a paste-filling process in the manufacturing of circuit boards in which there is provided a printing method and a printing apparatus according to a second embodiment of the present invention. The apparatus fundamentally operates the same effect as in the first embodiment. What is different from FIGS. 1, 2 is that the contact angle $\theta$ is changed to a predetermined value by the actuators A2, A3 while the driver 201 and the actuator A1 for driving the filling head 21 are eliminated. An angle sensor 100 is installed instead to detect an angle of the filling head 21 on the shaft 29. The contact angle θ is changed due to deflection of the filling head 21 caused by the actuators A2, A3. It is so constructed that angle information detected by the angle sensor 100 is inputed to the control part 31. Control part 31 in turn controls the angle of the filling head 21 to the predetermined value which is detected by the angle sensor 100, whereby the contact angle θ is kept at the predetermined value.

Third Embodiment

As indicated in FIG. 5, in an apparatus used in a paste-filling process in a manufacturing apparatus for circuit boards in which there are provided a printing method and a printing apparatus according to a third embodiment of the present invention, a filling head 121 has a squeegee of a triangular prism laid laterally. Two sides of the filling head 121 defining a right angle of a right triangle in lateral cross section are set schematically in parallel to the lateral direction and vertical direction. A holder 41 for supporting the filling head 121 is fixed to the filling head 121 along a vertical side. As shown in FIG. 5, the holder 41 supports a paste pressing face 121a of the filling head 121 in the vicinity of a part C which comes in touch with the printing face of the base material 4 on the stage 5. A part D of the pressing face 121a separated from the printing face is rendered a free end. More specifically, although a flat squeegee is employable in the third embodiment, the squeegee actually used in the embodiment is a slightly modified blade type of a triangular lateral cross section.

Thickness of the squeegee is gradually reduced from the part C of the pressing face 21a in touch with the printing face to the part D apart from the printing face.

In a supporting structure for the conventional flat squeegee type filling head, when the filling head 121 is lowered to touch the printing face of the base material 4 thereby impressing a printing pressure onto the base material 4 in order to fill the paste 22 the pressure by the holder is applied in the vicinity of the part D. The part D of the pressing face 121a is supported, whereas the part C in touch with the printing face is free and easily deflected or broken. In other words, the paste 22 leaks and the pressure is less at the part C although the pressure is important to fill the paste 22 to the through hole 4d of the base material 4. This results in failure in stable filling of the paste 22.

Moreover, with the conventional filling head, the contact angle θ defined between the filling head and the printing face decreases from an initially set value. Since the contact angle and the deflected contact part of the filling head to the printing face varies depending on a material of the filling head and on a structure of a printing material pressing part, adjustments are required.

When such a phenomenon occurs, the printing material filled in the through hole of the base material is undesirably scraped out. The phenomenon will occur unless the deflected front end of the conventional filling head is restricted to a necessary minimum to let the filling head trace the uneven printing face of the base material.

Meanwhile, the conventional square squeegee initially has its four corners rounded and therefore scrapes the paste extraordinarily poorly. Although a required or larger amount of printing pressure is needed due to the aforementioned poor scraping efficiency of the squeegee the scraping amount of the filled paste from the hole is unstable.

In contrast, according to the third embodiment of the present invention, the filling head 121 pressing and filling the paste 22 into the through hole 4d of the base material 4 is supported by the holder 41 at the part C of the pressing face 121a which is in touch with the printing face of the base material 4. Thus, the part D of the pressing face 121a away from the printing face becomes free and deformable. In consequence, a required flexibility can be achieved for the filling head 121 and the part C in touch with the printing face can suppress the loss of the pressing force in the paste 22. A required minimum elasticity fit to the uneven printing face of the base material 4 can be achieved by selecting an elastic material for the filling head 121. The filling head 121 of the embodiment can thus stably fill a predetermined amount of the paste 22 without a special control, even if the viscosity of the paste 22 is increased with time or the amount of the paste 22 is reduced due to the consumption. Continuous printing performance can be enhanced.

According to the third embodiment, the printing pressure acting on the printing face from the holder 41 via the filling head 121 is directly applied to the part C in touch with the base material 4, so that the contact angle can be less reduced even when the filling head 121 is deflected. Practically no deflection is generated at the contact part between the filling head 121 and the base material 4, as is observed in experiments. By employing the apparatus of the invention, conditions set for the filling head 121 can be kept constant during printing of the paste 22. If the printing apparatus is adapted for a circuit board-manufacturing apparatus to print the paste onto the boards, it becomes possible to maintain the set constant conditions for the filling head during manufacturing of the circuit boards, and produce circuit boards of constant quality. A manufacturing yield can be improved.

Fourth Embodiment

Figure 6:
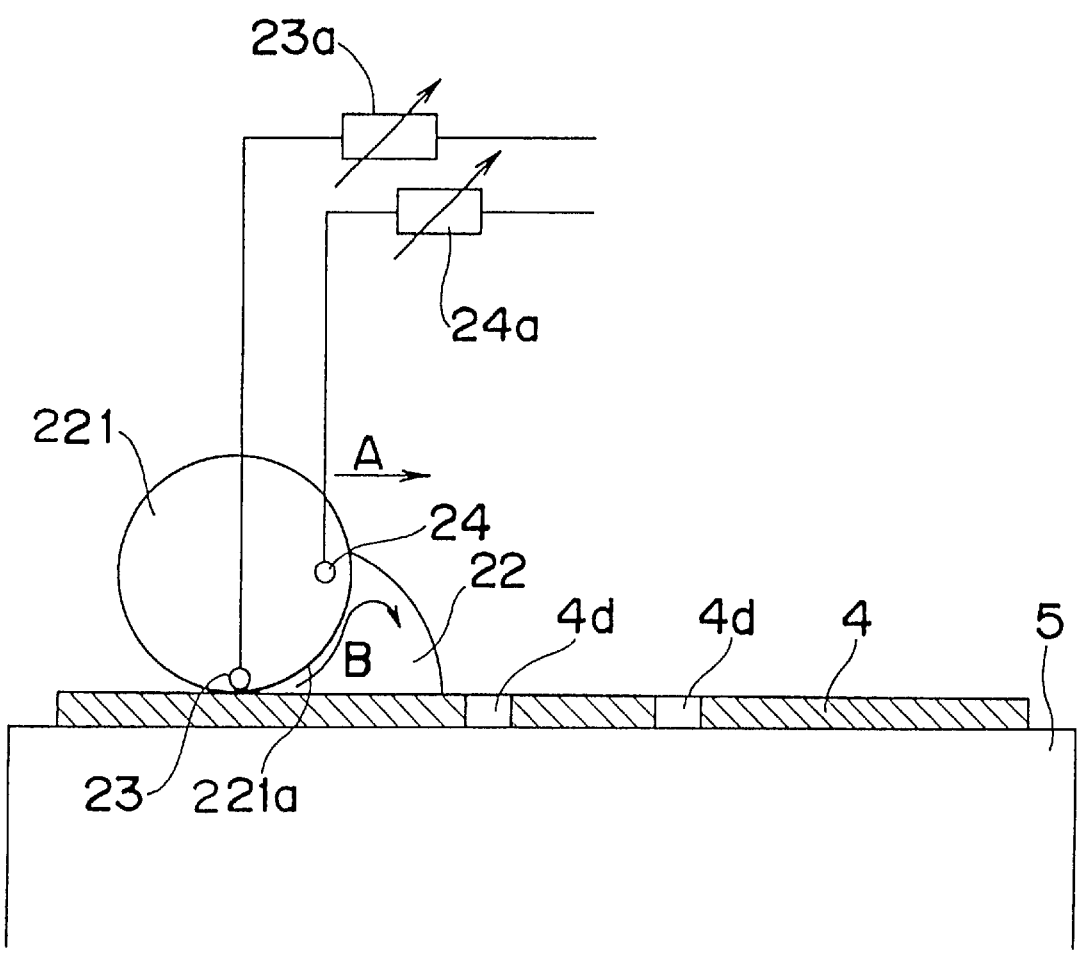
FIG. 6 is a diagram of a part with a paste-filling function of a circuit board-manufacturing apparatus in which a printing apparatus for executing a printing method in a fourth embodiment of the present invention is installed.

FIG. 6 is a schematic diagram of a process of filling a paste for a circuit board-manufacturing apparatus adopting a printing method and a printing apparatus according to a fourth embodiment of the present invention.

As indicated in FIG. 6, a cylindrical filling head 221 is moved to press and fill the paste 22 into the through hole 4d of the base material 4 held on the stage 5. At this time, the filling head 221 is not rotated.

The filling head 221 is made movable in an up/down direction and a filling direction shown by an arrow A in FIG. 6. In general, when the filling head 221 moves on the base material 4, the paste 22 present in the vicinity of a contact point between the filling head 221 and base material 4 is considerably hard to flow even if the viscosity of the paste 22 is lowered, due to a small movable area where the paste 22 is allowed to move and a small pressure gradient in the neighborhood of the filling head 221.

Although the fluidity of the paste 22 can be improved by raising a temperature of the paste 22, the life of the paste 22 is decreased if the paste 22 is a thermoset type. What is needed to secure the fluidity required for the paste 22 to be filled in the through hole 4d of the base material 4 is that only a part of the paste 22 which comes close to the through hole 4d of the base material 4 is heated. A force necessary for the paste 22 to be filled into the through hole 4d is obtained by hydraulic pressure generated by the filling head 221 and by rolling of the paste 22 denoted by an arrow B (e.g., D. E. Riemer: "INK HYDRODYNAMICS OF SCREEN PRINTING", Proceedings of the 1985 ISHM Symposium, pages 52–58).

The aforementioned rolling of the paste 22 is achieved when the paste 22 moves up from the printing face of the base material 4 along a paste pressing face 221a of the filling head 221. Therefore, if a predetermined temperature gradient is set on the pressing face 221a of the filling head 221, the fluidity of the paste 22 can be improved. More specifically, the temperature gradient of the pressing face 221a is set so that a temperature of the pressing face 221a is high at the side in touch with the printing face of the base material 4, and the temperature is lowered at the pressing face 221a away from the printing face of the base material 4. Thus, since the temperature of the pressing face 221a is high at the side in touch with the printing face of the base material 4, the viscosity of the rolling paste 22 is decreased. Therefore the fluidity of the paste 22 can be improved. On the other hand, since the temperature of the pressing face 221a is lowered at the side away from the printing face of the base material 4, the fluidity of the paste 22 is restricted. The hydraulic pressure of the contact part between the printing face of the base material 4 and the pressing face 221a is increased. Accordingly, a predetermined amount of the paste 22 is filled stably and at the same time, volatile components in the paste 22 are prevented from evaporating by the low-temperature part, making it possible to easily maintain the whole paste 22 at a predetermined viscosity. The paste 22 can show improved continuous printability.

Table 2 indicates a filling depth of the paste and a temperature difference in the filling head 221 under general filling conditions (for instance, pressure of 2 kgf/cm$^2$, speed of 40 mm/sec, amount of the paste (feeding amount) of 500 g).

TABLE 2

| Temperature difference (° C.) | Filling depth (mm) |
|---|---|
| 0 | 5 |
| 5 | 10 |
| 10 | 12 |
| 15 | 13 |

As is understood from Table 2, the filling force is improved when the temperature difference is not less than 5° C. (i.e., in the fourth embodiment wherein the temperature gradient is set for the pressing face) rather than when the temperature difference is 0° (i.e., in the conventional example using the filling head without the temperature gradient). By way of example, the temperature difference is preferably 10° C. when a solder paste is used.

According to the fourth embodiment, upper and lower heaters 24, 23 are built in the filling head 221 so as to provide the pressing face 221a with the temperature gradient as described above. In this arrangement, the lower heater 23 heats a part of the paste 22 in touch with the printing face, and the upper heater 24 heats so that the paste 22 separates from the printing face. The filling head 221 at the upper heater 24 has a lower temperature than the lower heater 23. As a result, the heaters 23, 24 realize such temperature gradient at the pressing face 221a of the filling head 221 that the temperature of the pressing face 221a at the side in touch with the printing face of the base material 4 is high, and decreases where the pressing face 221a is further away from the printing face.

It is generally known that volatile components if contained in the paste are lost subsequent to a temperature rise thereby increasing the viscosity of the paste. The part of the paste 22 away from the printing face and the filling head 221 exposed to the outside air is made lower in temperature than the part at the pressing face 221a in touch with the printing face of the base material 4. Since this temperature is even lower than an evaporation temperature of the volatile components, the paste 22 can be prevented from being hardened as a result of the evaporation of the volatile components. The continuous printability can be enhanced.

Figure 7:
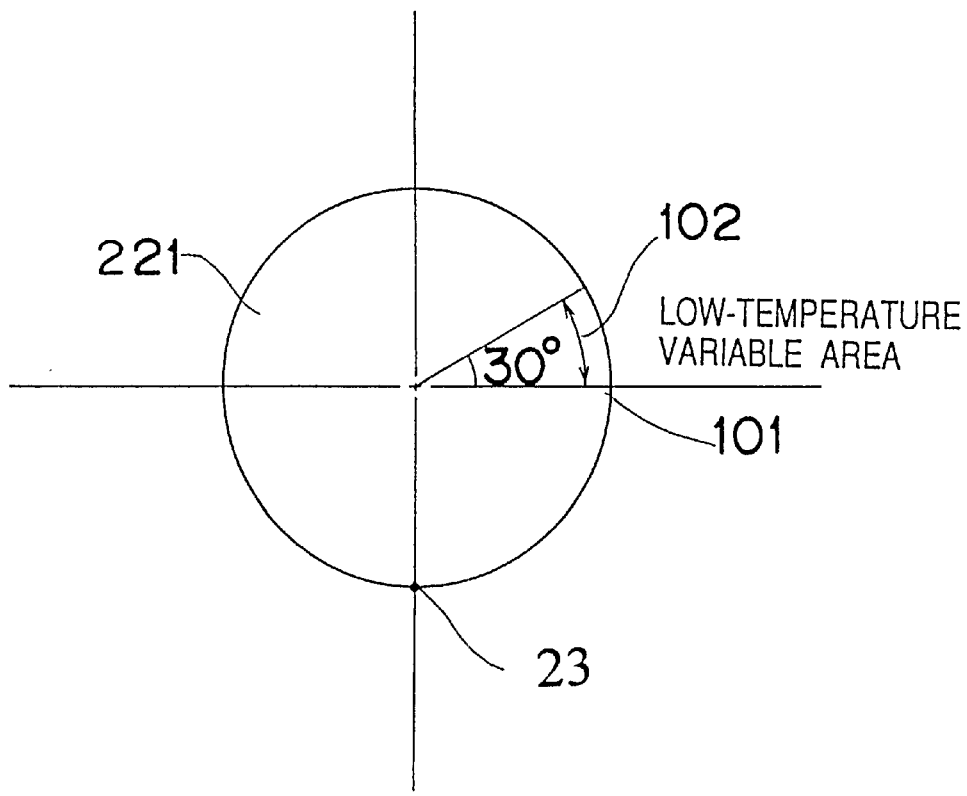
FIG. 7 is a diagram explanatory of an arrangement of a low temperature heater of a filling head in FIG. 6.

FIG. 7 is a diagram explanatory of an arrangement of the upper heater 24 at the low-temperature side of the filling head 221. The upper heater 24 is generally disposed, as is clearly shown in FIG. 7, to pass the center of the filling head 221 in a low-temperature variable area 102 approximately 30° above a plane 101 in parallel to the printing face of the base material 4. A position of the upper heater 24 should be determined within the above range from a relationship with the amount of the paste, because the paste 22 generally does not move up to the pressing face 221a of the filling head 221 over the range. In case there is supplied a large amount of the paste, the upper heater 24 is preferably arranged slightly upward within the range. On the other hand, if the paste of a small amount is supplied, the upper heater 24 is preferably installed slightly downward within the range. When the paste 22 is a solder paste, it is preferred, e.g., that the lower heater 23 heats the paste up to 45° C., while the upper heater 24 heats approximately to a room temperature. If the paste 22 does not include volatile components, the paste may be heated up to 50° C. or 60° C. When the paste 22 is maintained at approximately room temperature by the upper heater 24, the upper heater 24 may be set at a lower temperature than the room temperature to slightly cool the paste 22 heated by the lower heater 23. An apparatus shown in FIG. 9 which will be described later is preferably used if it is necessary to positively cool the paste 22.

Figure 8:
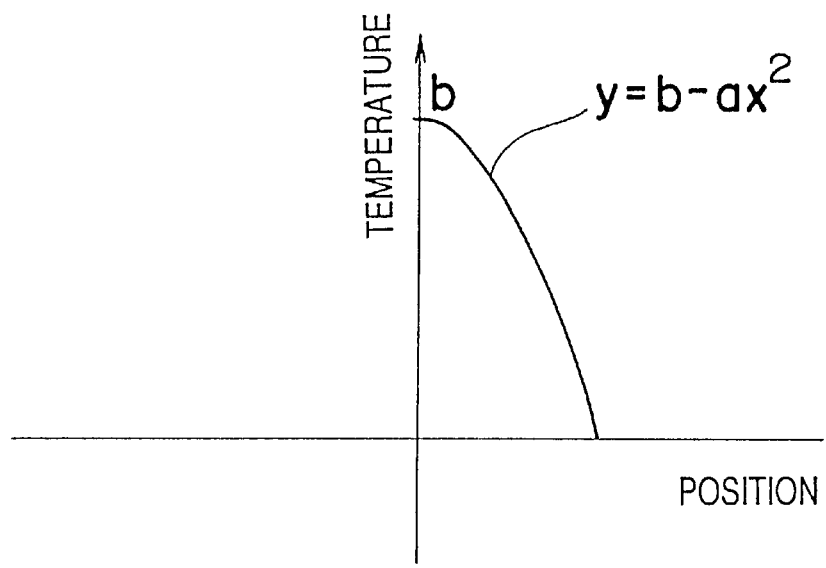
FIG. 8 is a diagram of a temperature distribution of a face of the filling head of FIG. 6 in touch with a paste.

An example of the above-described temperature gradient is preferably a curve satisfying $y = b - ax^2$, as in FIG. 8, wherein b and a are constants optionally determined in accordance with characteristics of the paste 22. In this graph, a position of the lower heater 23 in FIG. 6 is indicated as an origin of an axis of abscissa, and an intersection point between the curve and the axis of abscissa is an arranging position of the upper heater 24.

The above temperature gradient may be similarly achieved by using only the lower heater 23 or interposing a suitable number of heaters between the upper and lower heaters 24 and 23. The temperature gradient can be defined more forcibly and finely if the number of heaters is large. Alternatively, a continuous single heater may be incorporated from the lower heater 23 to the upper heater 24 to gradually reduce thermal capacity (generating calorie).

As is indicated in FIG. 6, in the fourth embodiment, variable resistors (volumes) 23a, 24a are set in an energizing circuit of the heaters 23, 24, thereby regulating the amount of heat from the heaters 23, 24 to obtain the temperature gradient in various forms. Circuit boards of various conditions can accordingly be manufactured with high degree of quality to meet a wide variety of conditions for the paste 22 and filling conditions for the paste 22.

Although the heaters 23, 24 are used as an example of the temperature-adjusting element in the fourth embodiment, the element is not limited to this and any optional element can be used so long as it can adjust temperatures.

Fifth Embodiment

Figure 9:
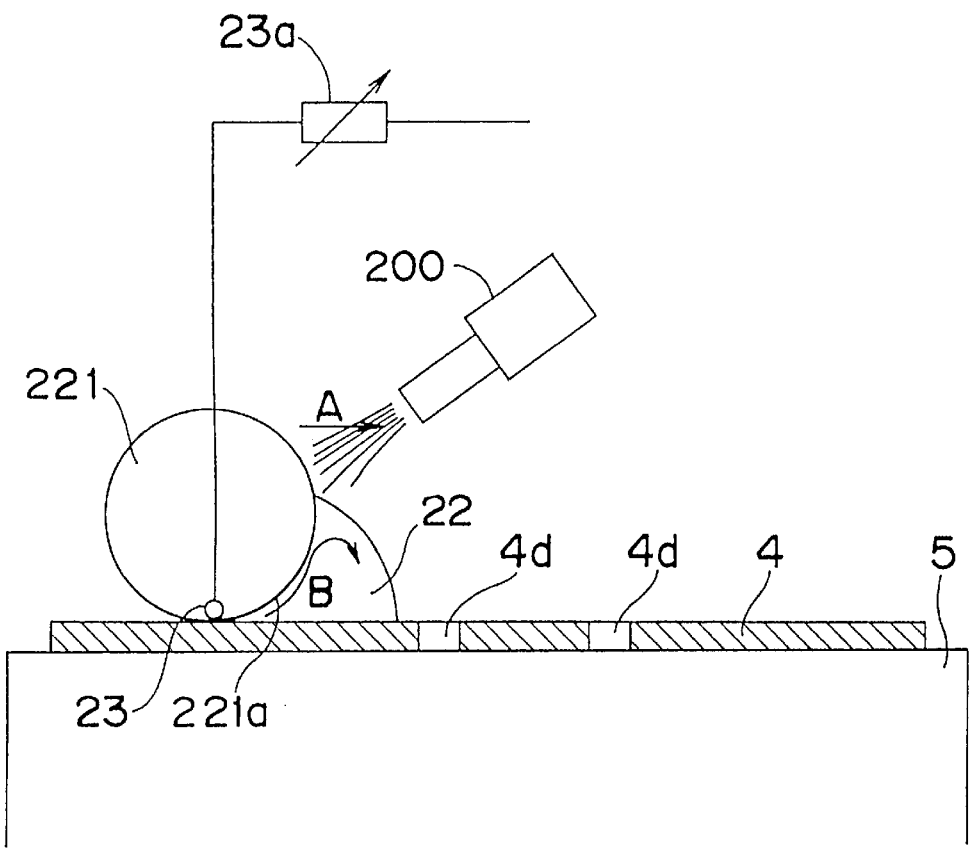
FIG. 9 is a diagram of a part with a paste-filling function of a circuit board-manufacturing apparatus in which a printing apparatus for executing a printing method in a fifth embodiment of the present invention is installed.

FIG. 9 is a schematic diagram of a process of filling a paste in a circuit-board manufacturing apparatus adopting a printing method and a printing apparatus according to a fifth embodiment of the present invention. A difference from FIG. 8 is that the upper heater 24 is eliminated, and a cooling device 200 is set at a position corresponding to the position of the upper heater 24 to supply cool air onto the pressing face 221a of the filling head 221. In the fifth embodiment, the lower heater 23 heats the part of the paste 22 in touch with the printing face. The cooling device 200 prevents the part of the paste 22 separated from the printing face and the filling head 221 from being raised to a temperature not lower than a necessary temperature because of heating by the lower heater 23. Owing to this arrangement, a required temperature difference is maintained between the part of the paste 22 away from the printing face and the filling head 221 and the part of the paste 22 in touch with the printing face.

Sixth Embodiment

Figure 10:
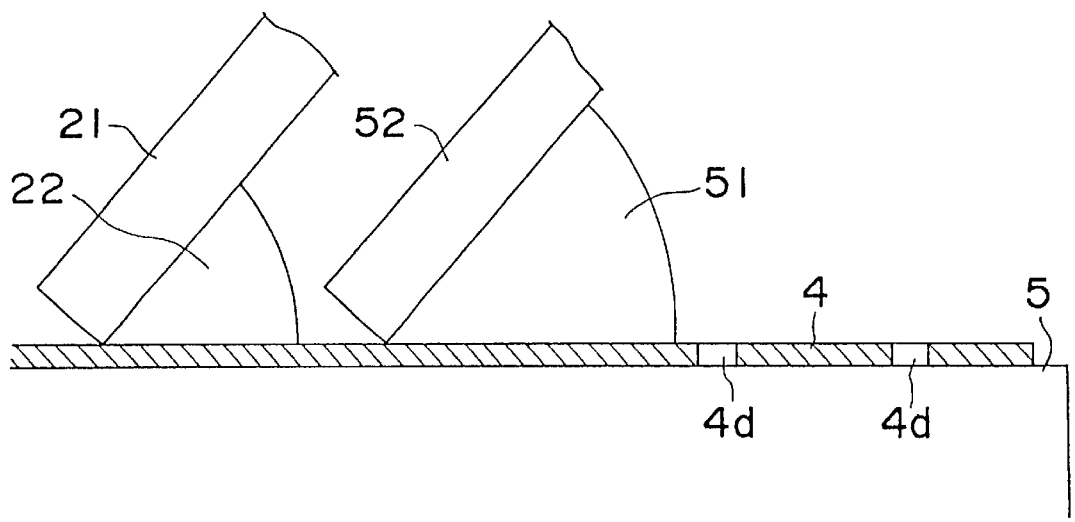
FIG. 10 is a diagram of a part with an applying function for a nonvolatile organic component in a paste of a circuit board-manufacturing apparatus in which a printing apparatus for executing a printing method in a sixth embodiment of the present invention is installed.

FIG. 10 is a schematic diagram of a filling apparatus which shows a pretreatment state before filling the paste to manufacture a circuit board with a printing method and a printing apparatus according to a sixth embodiment of the present invention provided.

In the sixth embodiment, as shown in FIG. 10, before the paste 22 is pressed and filled by the filling head 21 to the printing face of the base material 4 on the stage 5, a pretreatment material 51, which is a nonvolatile component included in the paste 22 is applied to the printing face of the base material 4. The apparatus is equipped with the filling head 21 and also a pretreatment head 52 for applying the pretreatment material 51. In a process of filling the paste 22, by the filling head 21 to the through hole 4d of the base material 4, the same nonvolatile organic component as contained in the paste 22 is applied as the pretreatment material 51 by the pretreatment head 52 to the printing face of the base material 4 before the paste 22 is filled in the through hole 4d.

The pretreatment head 52 moves on the base material 4 while maintaining contact with the base material 4 to apply the pretreatment material 51 to the printing face of the base material 4. The pretreatment material 51 is sufficiently scraped by the pretreatment head 52 from the printing face of the base material 4, but a part of the pretreatment material 51 adsorbed by the printing face of the base material 4 is left on the printing face of the base material 4. The adsorption on the printing face of the base material 4 during the filling of the paste 22 into the through hole 4d causes an increase of the viscosity of the paste 22. To resolve this viscosity increase of the paste 22, the same component that adsorbs into the printing face of the base material 4 is preliminarily applied to the printing face of the base material 4 before the paste 22 is printed. Since the component adsorbed into the base material 4 is supplied to the paste 22 during printing of the paste 22, the increase of the viscosity of the paste 22 can be prevented.

Figure 11:
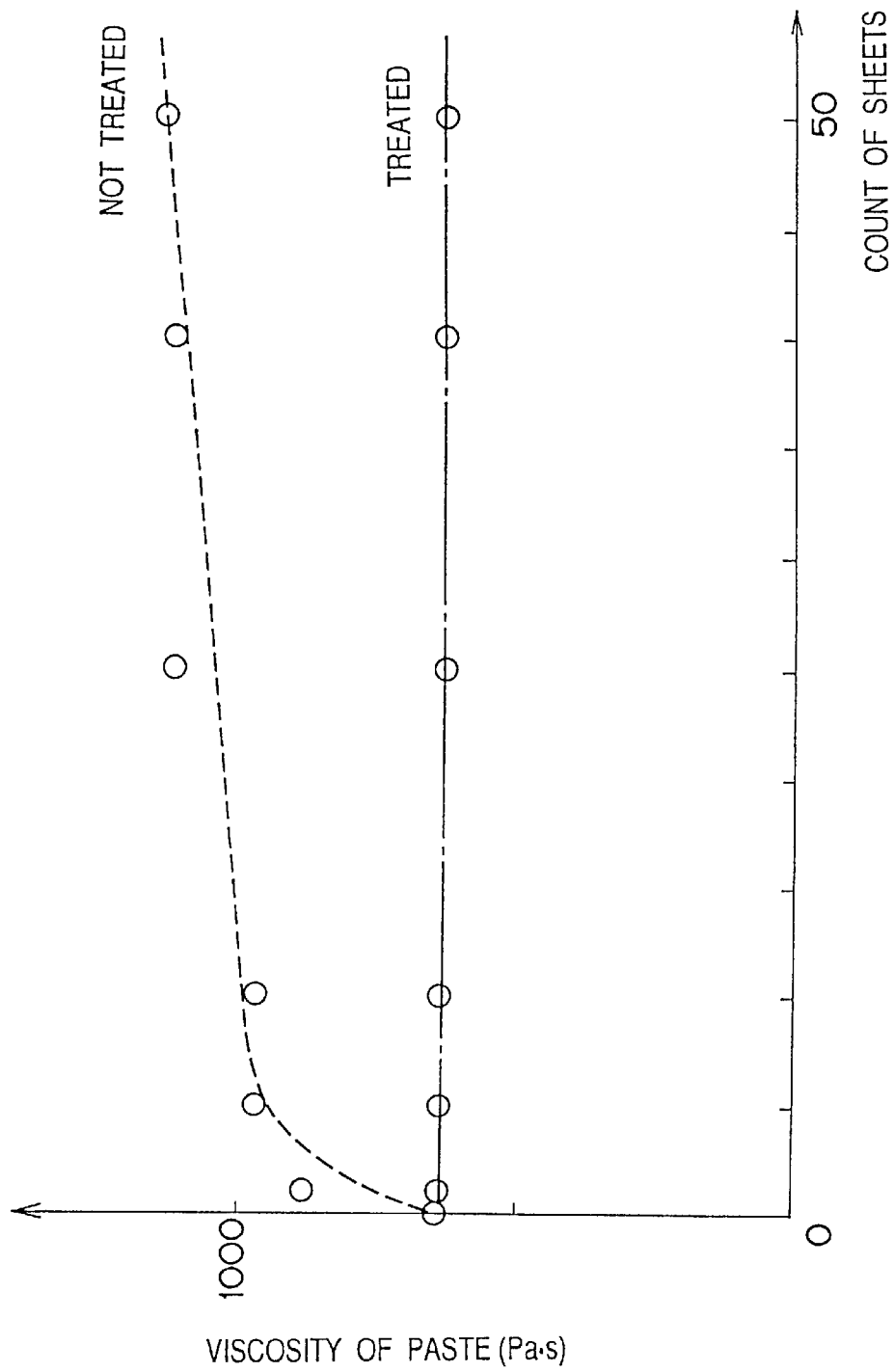
FIG. 11 is a graph of results of a viscosity increase when the nonvolatile organic component in the paste is applied onto a base material and when the nonvolatile organic component in the paste is not applied onto the base material in the sixth embodiment.

Results of the viscosity increase of the paste 22 when the nonvolatile organic component in the paste 22 is applied as the pretreatment material 51 onto the base material 4 beforehand (represented by "treated") and when the pretreatment material 51 is not applied on the base material 4 beforehand (represented as "not treated") are shown in FIG. 11. As is apparent from FIG. 11, the viscosity of the paste is constant when the nonvolatile organic component of the paste is applied, while the viscosity of the paste is increased when the organic component is not applied. Therefore, the application of the nonvolatile organic component can be effective to restrict the viscosity increase of the paste.

From the graph of FIG. 11, the pretreatment material 51 is considered to be scraped an equal amount to the paste 22 by the base material 4 and the pretreatment head 52. If the scraping is not carried out enough, the organic component remains on the surface of the base material 4 thereby decreasing the viscosity of the paste 22. Therefore, much care should be taken.

As the above result, the viscosity increase of the paste 22 is restricted due to the application of the nonvolatile organic component in the paste 22 onto the base material before the paste 22 is filled. The continuous printing efficiency. can be improved.

In the sixth embodiment, the filling head 21 and the pretreatment head 52 are preferably formed in the same shape, structure, and material in order to make the scraping condition equal. An application head for the pretreatment head 52 is a polyurethane squeegee in the above sixth embodiment, similar to the filling head 21. However, the same effect is obtained even when the organic component is adsorbed onto the base material by vapor deposition or the like manner.

Seventh Embodiment

Figure 12:
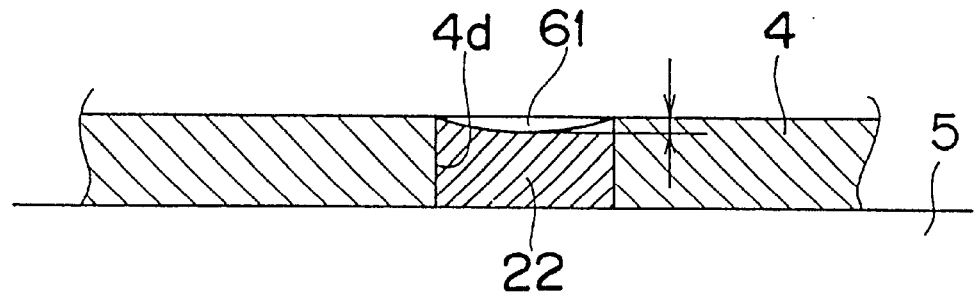
FIG. 12 is a diagram showing a state of the paste after filled according to a circuit board-manufacturing method representing a seventh embodiment of the present invention.
Figure 13A:
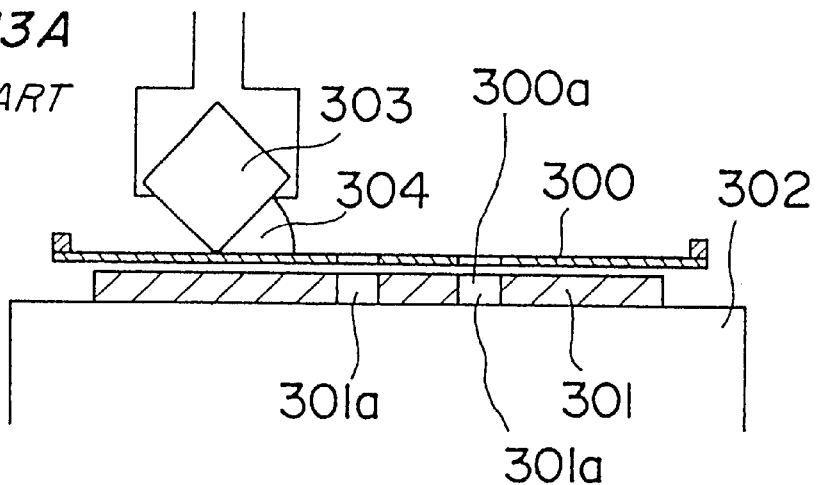
FIGS. 13A, 13B are diagrams of conventional printing apparatuses.
Figure 13B:
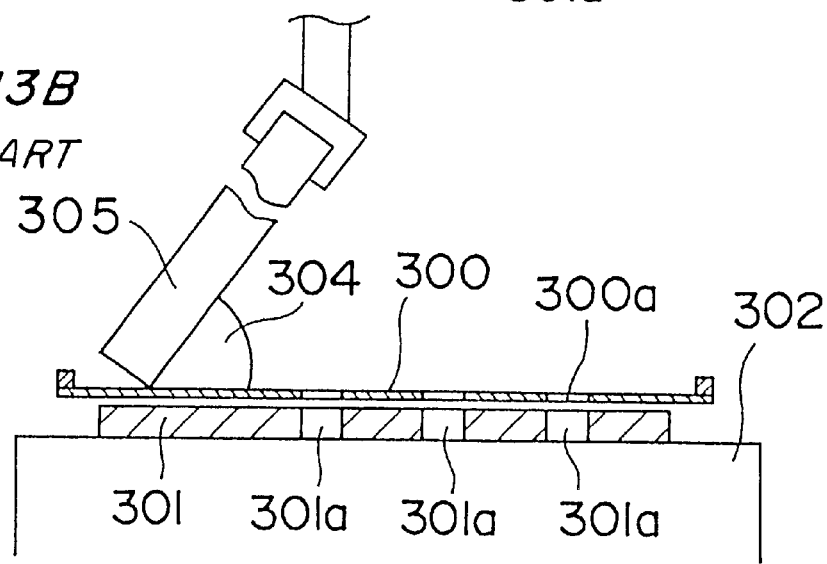

FIG. 12 is an explanatory diagram of a state where the paste is filled in a paste-filling apparatus for circuit boards with a printing method and a printing apparatus according to a seventh embodiment of the present invention provided.

According to the seventh embodiment, as shown in FIG. 12, a process presses and fills the paste 22 into the through hole 4d of the compressive base material 4. When the paste 22 is filled into the through hole 4d of the base material 4, 5–20% of the through hole 4d is not filled with the paste 22, as designated by 61.

Accordingly, when the base material 4 is compressed, the paste 22 is allowed to escape into the non-filled part 61, thereby preventing disconnection of connection parts in the layers of the circuit board caused by the expansion of the paste 22 if the non-filled part 61 did not exist.

Concretely, after the paste 22 is filled in the through hole 4d of the base material 4, the base material is heated and pressed while held between copper foils, whereby a double-face board is formed. Then, the copper foils are etched in a predetermined pattern to thereby produce a circuit board. When the base material 4 is heated and pressed while held between the copper foils in this series of operations, if the base material 4 is compressed by a degree larger than a tolerance for the paste 22 filled in the through hole 4d of the base material, the paste 22 when hardened will generate a force which will separate the copper foils from the base material 4. This brings about a large deterioration in the connection reliability of the layers. This is caused due to a part of the paste 22 exceeding the tolerance cannot escape when the paste filled in the through hole 4d is compressed too much. The paste 22 leaks into the base material 4 if the base material 4 is porous, resulting in a decrease of an insulation resistance, etc. and worsening reliability of the circuit board. This problem should be avoided.

When the non-filled part 61 is provided in the through hole 4d of the base material 4 to function as an expansion area for the paste 22, the compressed paste 22 in excess of tolerance is accommodated within the through hole 4d of the base material 4, so that the aforementioned issue can be eliminated. Table 3 shows good and defective connection resistances when an average diameter of the through hole 4d and depth of the non-filled part 61 in relation to the average diameter are changed.

TABLE 3

| Hole Diameter | Depth of non-filled part | Reliability | Hole Diameter | Depth of non-filled part | Reliability |
|---|---|---|---|---|---|
| 200 μm | 0% | NG | 100 μm | 0% | NG |
| | 5% | OK | | 5% | OK |
| | 10% | OK | | 10% | OK |
| | 20% | OK | | 20% | OK |
| | 25% | NG | | 25% | NG |
| 150 μm | 0% | NG | | | |
| | 5% | OK | | | |
| | 10% | OK | | | |
| | 20% | OK | | | |
| | 25% | NG | | | |

From Table 3 above, when the non-filled part is 5–20% to the average hole diameter is formed, the reliability of the connection resistance can be ensured. From the above results, when the paste 22 is pressed and filled so that the depth amount of the through hole 4d of the base material 4 becomes 5–20% of the average diameter of the through hole 4d of the base material 4, it can be shown that the connection parts of the layers are separated by the repulsion force of the compressed base material 4. Thus, the reliability is deteriorated.

In each of the foregoing embodiments of the present invention, a direct printing method is described in which the filling head directly runs on the printing face of the base material without using a mask. However, each embodiment is applicable in the same way where a mask (metal mask or the like) is set on the base material 4 and the filling head runs on a printing face of the mask.

As described in any of the first through seventh embodiments, the flow pressure of the paste is kept nearly constant while the paste (an example of the printing material) is filled. The filling amount of the paste is thus secured enough into the through hole(s) of the base material (an example of the body to be printed) in conformity with various filling conditions. The yield, quality, and productivity can be improved in the present invention.

According to the printing method and the printing apparatus of the embodiment(s) of the present invention, at least either the contact angle of the filling head to the printing face of the base material or metal mask, or the speed of the filling head is changed in accordance with a predetermined condition, namely, a change of the amount of the paste as the filling head moves forward. Even the increase of the viscosity of the paste or the decrease of the filling and pressing force due to the consumption of the paste with time can be handled in this manner. A predetermined amount of the paste can be stably and surely filled thereby improving continuous printing performance.

In the printing method and printing apparatus of the embodiment(s) of the present invention, the filling head for pressing and filling the paste into the through hole(s) of the base material or metal mask is supported at the side where the pressing face is in touch with the printing face of the base material or metal mask. On the other hand, the filling head at the side separated from the printing face is rendered a free end and deformable, thereby securing necessary flexibility. While the pressure to the paste at the side in touch with the printing face is restricted not to leak, a necessary minimum degree of elasticity is required to let the filling head trace the uneven printing face of the base material or metal mask. A predetermined amount of the paste can be stably filled without any special control means provided against the increase of the viscosity or reduction of the volume through consumption of the paste with time. Continuous printing efficiency can be improved.

In the printing method and printing apparatus of the embodiment(s) of the present invention, the temperature-adjusting element is incorporated within the filling head to apply the predetermined temperature gradient to the pressing face of the filling head. The temperature of the pressing face at the side in touch with the printing face is high and the temperature is decreased as the pressing face is separated away from the printing face. The viscosity of the rolling paste of a part in touch with the printing face is lowered thereby improving the fluidity of the paste. At the same time, the fluidity at the pressing face at the side away from the printing face of the base material or metal mask and the filling head is restricted because the temperature is lowered. Since the hydraulic pressure at the pressing face of the part in touch with the printing face is increased, not only a predetermined amount of the paste is stably filled, but the volatile component is prevented from evaporating at the low temperature part. The whole paste can be easily maintained at a predetermined viscosity and therefore continuous printing efficiency can be improved.

When the heater (an example of the temperature adjusting element) is set to an optimal temperature gradient, high quality printing can be achieved in various conditions in conformity with a variety of conditions of the paste and filling conditions of the paste.

In the printing method and printing apparatus of the embodiment(s) of the present invention, the pretreatment material is applied by the filling head and the pretreatment head, provided side by side, before the paste is filled onto the printing face of the base material or metal mask. A positive effect of applying the nonvolatile organic substance can be gained in one filling process. If the nonvolatile organic component in the paste is applied onto the base material or metal mask before the paste is filled, the viscosity of the paste is prevented from rising, therefore enhancing continuous printability.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

We claim:

1. A method of printing, which comprises:

pressing and filling a printing material into a through hole of a circuit board placed on a stage and having a printing face with a filling head having a pressing face with a first side at which the pressing face contacts the printing face and a second side away from the first side; and maintaining a constant flow pressure in the printing material in order to fill the through hole of the circuit board;

wherein said maintaining comprises holding said filling head such that said first side of said pressing face is held to be supported and said second side of said pressing face is free and unsupported.

2. A printing apparatus for pressing and filling a printing material into a through hole of a circuit board placed on a stage and having a printing face, comprising:

a filling head for filling the printing material into the through hole, wherein said filling head has a pressing face which has a first side which contacts the printing face during operation and a second side away from said first side; and a holding device which supports said filling head at said first side so that a flow pressure of the printing material is maintained constant, wherein said second side of said pressing face is free and unsupported.

3. A printing apparatus for pressing and filling a printing material into a through hole of a circuit board having a printing face, comprising:

a filling head for filling the printing material into the through hole, wherein said filling head has a pressing face which has a first side which contacts the printing face during operation and a second side away from said first side; and a holding means for supporting said filling head at said first side so that a flow pressure of the printing material is maintained constant and so that said second side of said filling head is free and unsupported.

* * * * *